United States Patent [19]

Hiramoto

[11] 3,978,361
[45] Aug. 31, 1976

[54] LIGHT SOURCE DEVICE
[75] Inventor: Tatsumi Hiramoto, Himeji, Japan
[73] Assignee: Ushio Electric Inc., Tokyo, Japan
[22] Filed: Aug. 22, 1975
[21] Appl. No.: 606,950

[30] Foreign Application Priority Data
 Sept. 3, 1974 Japan............................ 49-105321

[52] U.S. Cl................................. 313/35; 240/47; 313/44
[51] Int. Cl.² ......................................... H01J 61/52
[58] Field of Search ............. 313/35, 44, 11; 240/47

[56] References Cited
UNITED STATES PATENTS
3,120,928  2/1964  Gotze.................................. 240/47

Primary Examiner—R. V. Rolinec
Assistant Examiner—Darwin R. Hostetter
Attorney, Agent, or Firm—James E. Nilles

[57] ABSTRACT

A light source device having an elongated baffle plate positioned between a light source and a cooling means for regulating a cooling flow from said cooling means. Said baffle plate has a slit and bent portions extending for covering said light source so that the bulb wall of the light source is evenly cooled.

4 Claims, 10 Drawing Figures

LIGHT SOURCE DEVICE

The present invention relates to a light source device having a high power consumption light source and more particularly to a light source device having a tubular elongated high pressure mercury-arc lamp, which has a high power consumption and thermal load.

Tubular elongated high pressure lamps, which are used for a high power consumption light source such as the light source for a diazo wet type copying machine, have hitherto been utilized in a wide field because they have many advantages due to their wide spectral distribution which extends from the ultraviolet region to the visible region. Accordingly, attempts have been made to utilize the high pressure mercury-arc lamp as a typical artificial light source during production processes or for pollution prevention.

Such a light source is not used as it is, however, but used while it is encased in a lamp house. In the case of a light source device having a high power consumption light source, the inside of said light source device becomes very cramped because it contains a cooling blower, mirror, shutter and accesories. Further, demands have been made to develop a smaller light source device having a high power consumption light source and to speed up the production process of articles for industrial use. For example, a smaller light source for drying ultraviolet hardened type printing ink has been developed to employ a high power consumption light source.

Up to date, a more preferable light source device for drying ultraviolet hardened type printing ink has not yet been completed for many reasons. It was found by the inventor that in a light source device having a tubular elongated high power consumption light source, more particularly, a tubular elongated high pressure mercury-arc lamp, which has a high thermal load and into which electrical input energy is more than 90 watt per 1 cm of arc, the temperature distribution at the bulb wall becomes remarkably uneven and the bulb wall is liable to be locally broken by generation of large thermal stress.

Referring to FIG. 1, FIG. 2, and FIG. 4, a light source device normally comprises a house 1, a blower 4 on the back wall of the house 1, a gutter-shaped mirror divided into two sections 2, 2' and a light source 3 such as a tubular elongated high pressure mercury-arc lamp within the house 1. The light source 3 is cooled centering around the center of said light source 3 by a cooling wind only directed at a right angle to the axis of said light source 3. Accordingly, as shown in FIG. 4 the cooling effect at a portion 3a of bulb wall nearest to blower 4 or on the upstream side of the cooling wind becomes high, but at a portion 3b farmost from blower 4 or on the downstream side of the wind becomes low. This is because the angle $\phi$ showing the degree of the turn of the cooling flow of the wind around the bulb wall is about 20° without being effected by the wind velocity and therefore vortexes are generated in the vicinity of said portion 3b.

Generally, if the high power consumption light source is made smaller, the bulb wall load of the light source increases, so that the thermal load of the bulb wall becomes high and a stronger cooling flow is needed. If a cooling flow is stronger, portion 3a, however, is over cooled, and then a light of predetermined large capacity cannot be obtained because the mercury in the light source fails to vaporize fully. On the contrary, portion 3b is not cooled fully because of the small angle $\phi$, and then the bulb wall is liable to be locally broken by generation of large thermal stresses. According to the above reasons, a preferable light source device for drying ultraviolet hardened type printing ink has not yet been completed. That is to say, it is not enough to cool strongly the bulb wall where the thermal load of the bulb is high, but necessary to adopt a suitable cooling flow for the light source.

One object of the present invention is to provide a smaller light source device having a high power consumption light source such as a tubular elongated light source, wherein the bulb wall of the light source is evenly cooled to prevent local damage to its bulb wall and to enable the light source to emit a light of predetermined large capacity.

Another object of the present invention is to provide a smaller light source device having a tubular elongated high pressure mercury lamp, wherein said lamp has an electrical input power more than 90 watt per 1 cm of arc for servicing to dry ultraviolet hardened type printing ink.

Still another object of this invention will become apparent from the following description when taken in conjunction with the accompanying drawing, in which.

Figure 1:
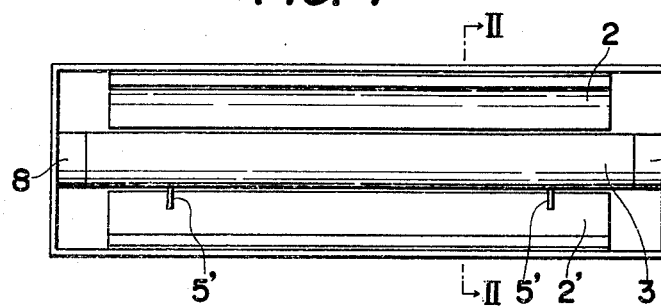
FIG. 1 is a front view of a light source device of the present invention.
Figure 2:
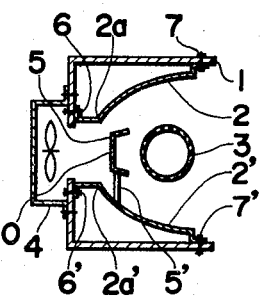
FIG. 2 is a view in section taken on the line II—II of FIG. 1.

In FIGS. 1 and 2, reference numeral 1 designates an elongated box-shaped house. 2 and 2' designate each sections of divided mirror respectively, fixed on the inside wall of said house 1 by means of volts 6, 7, 6' and 7' etc. 3 is a tubular elongated light source supported by holding means 8 and 8' which in turn are supported on the side wall of house 1. 4 is a blower positioned on the back wall of house 1 so as to cool said light source 3.

In the present invention, a baffle plate 5 is provided between blower 4 and light source 3 and supported through supporters 5' by said mirror 2' so that the cooling flow from blower 4 does not directly strike light source 3. Especially, baffle plate 5 is arranged in a position between the narrowest portion, so called throat, 2a – 2a' made by mirrors 2 and 2' and light source 3.

Figure 3:
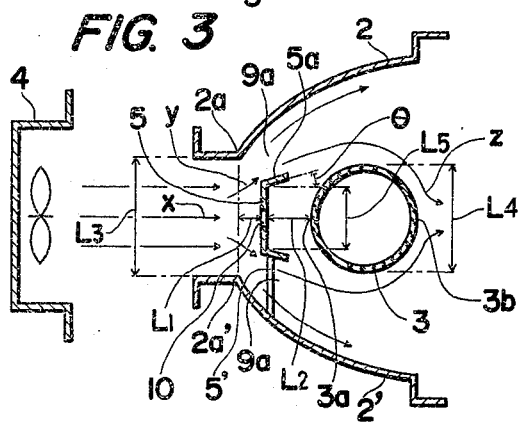
FIG. 3 is a schematic view of a cooling flow within the light source device of the present invention.

The position of baffle plate 5 in relation to throat 2a – 2a' and light source 3 is shown in detail in FIG. 3.

The following values in dimension are designed in order to obtain experimental data.

The length $L_3$ of the throat is 30 mm, the length $L_1 + L_2$ between the throat and the outer surface of light source 3 is 20 mm, length $L_1$ between the throat and baffle plate 5 is 5 mm, length $L_2$ between the baffle plate 5 and the outer surface of light source 3 is 15 mm, the outer diameter $L_4$ of light source 3 is 28 mm, and the width $L_5$ of baffle plate 5 is 18 mm. Bent portions 5a are out by a bending angle of $\theta$ at both upper and lower portions of said baffle plate 5 as a unit. The $\theta$ in this case is 15°.

The wind from blower 4 flows smoothly on the blower side with respect to the throat as an arrow x and is recognized as a laminar flow. However, the wind of the baffle plate side with respect to the throat flows as an arrow y through a clearance 9a between the mirrors 2 and 2' and bent portions 5a while having its current disturbed only slightly. When the current y reaches the end portion of the bent portions 5a, a part of current y becomes current z which in turn reaches portion 3b of the bulb wall farmost from blower 4 through a path along the outer surface of light source 3.

The feature of the present invention lies in the fact that current z is produced.

Figure 4:
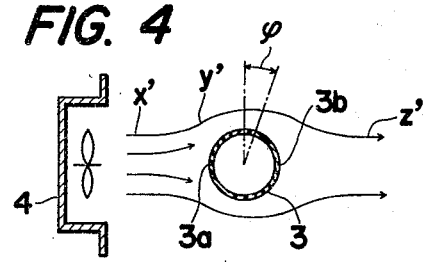
FIG. 4 is a schematic view of a cooling flow within the old fashioned device.

In FIG. 4 showing a cooling flow within the old fashioned device, no baffle plate 5 is provided. A laminar flow x' from blower 4 becomes a flow y' in the vicinity of portion 3a of the bulb wall nearest to blower 4 and then becomes a flow z' which is turned a little toward portion 3b of the bulb wall farmost from blower 4. The angle $\phi$ showing the degree of the turn of the cooling flow is about 20° and is not so related to the wind velocity. Accordingly, portion 3b of the bulb wall farmost from blower 4 is not cooled fully. Further, under normal conditions the cooling flow velocity is 1 m/sec – 10 m/sec and $\phi$ is about 20°, so that portion 3b of the bulb wall farmost from blower 4 is not cooled sufficiently.

In the present invention, however, baffle plate 5 has bent portions 5a at the upper and lower portions and is arranged in a position between blower 4 and light source 3 and more particularly between light source 3 and said throat.

Accordingly, in the present invention, said angle $\phi$ can be increased to about 80°, so that portion 3b of the bulb wall farmost from blower 4 can be cooled more effectively.

Figure 5:
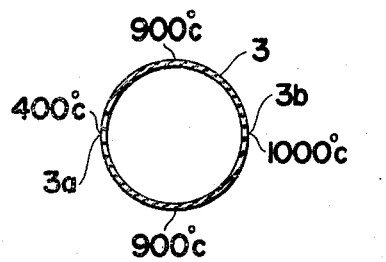
FIG. 5A is a schematic view of the temperature distribution on the bulb wall within the old fashioned device.
FIG. 5B is a schematic view of the temperature distribution on the bulb wall within the device of the present invention.
Figure 5:
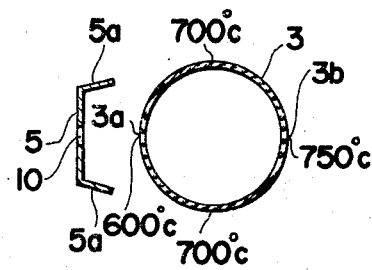

FIG. 5A shows the temperature distribution on the bulb wall in case no baffle plate is provided and FIG. 5B shows the temperature distribution on the bulb wall in case the baffle plate is provided when a light source is a tubular elongated high pressure mercury-arc lamp of 1KW electrical input. As apparent from the temperature comparison, the remarkable effect of the baffle plate can be recognized.

As described above, the light source device of the present invention comprises a house 1, mirrors 2, 2' and a light source 3 encased in said house 1, and a blower 4 arranged on the back wall of said house 1 so as to cool said light source 3, and is characterized in that a baffle plate 5 having bent portions 5a extending obliquely from the upper and lower portions of plate 5 is provided between blower 4 and light source 3 and more particularly between a throat made by mirrors 2 and 2' and light source 3, so that the cooling flow from blower 4 is turned to portion 3b source of the bulb wall farmost from blower 4, and light source 3 can be cooled more effectively.

Figures 6, 7:
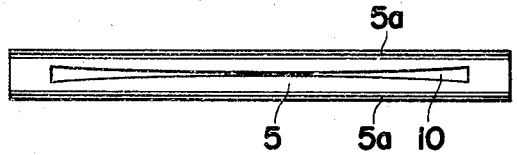
FIG. 6 is a front view of a baffle plate used for the present invention.
FIG. 7 is a front view of another baffle plate used for the present invention.

In the present invention, baffle plate 5 is made as shown in FIG. 6.

In this case, a slit 10 extending along the axis of the tubular elongated light source 3, and becoming narrower going toward the center is provided in the center portion of baffle plate 5.

The reason why slit 10 is provided in baffle plate 5 is that a small quantity of wind from blower 4 is directed so as to hit directly portion 3a of the bulb wall nearest to blower 4 in order to cool fully portion 3a even if light source 3 is covered by baffle plate 5.

Slit 10 is made so that its center portion is narrowest to increase the flow resistance, thereby preventing the cooling of the opposite ends of light source 3 from becoming weak and the cooling of the center of light source 3 from becoming strong. By this arrangement, the distribution of the wind in the longitudinal direction of light source 3 can be controlled.

The construction of the baffle plate of the present invention described above is most suitable in the case where the tubular elongated light source is cooled by the cooling flow directed at a right angle to the axis of the light source from one blower as shown in FIG. 2. According to the present invention, the maximum effect of the cooling effect can be obtained by using a minimum means of cooling.

The other feature of the baffle plate is shown in FIG. 7. In this case, the slit is composed of a small opening 11a positioned in the center of baffle plate 5, and openings 11b, 11c and 11d arranged side by side in the longitudinal direction of baffle plate 5, each having a diameter which is increased toward the ends from the center portion of baffle plate 5. Baffle plate 5 shown in FIG. 7 has the same effect as that of baffle plate 5 shown in FIG. 6.

Further, if a mirror surface is provided on the surface of the baffle plate facing to the light source so as to act as a mirror, the coefficient of utilization of light as a light source device can be elevated.

The other embodiment of mirrors 2 and 2' will now be explained with reference to FIGS. 8 and 9.

Figure 8:
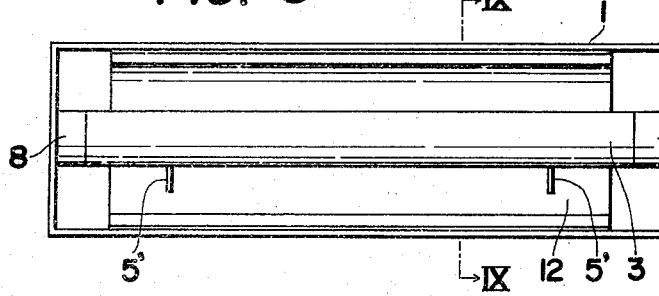
FIG. 8 is a front view of another embodiment of the present invention.
Figure 9:
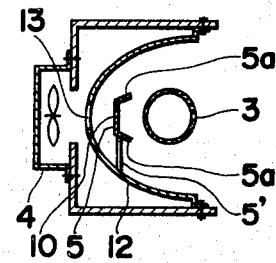
FIG. 9 is a view in section taken on the line IX—IX of FIG. 8.

In FIGS. 8 and 9, baffle plate 5 is the same as the one shown in FIG. 7. Mirror 12 is composed of a metal reflex mirror and has openings 13 arranged side by side in the longitudinal direction of mirror 12. Openings 13 correspond in position to the throat of the mirror. The diameter of the center-opening is made the smallest and the diameter of the opening in the opposite ends it made the largest in order to improve the distribution of wind in the longitudinal direction of light source 3.

In such a light source device where a tubular elongated light source is cooled by the cooling flow in a direction perpendicular to the axis of the light source from one blower, it is preferable to provide openings in the baffle plate, the center opening of which is the smallest in diameter and the opposite end openings of which are the largest in diameter. The baffle plate shown in FIG. 7 is the most usable, because it is easy to manufacture.

As stated above, according to the present invention, a small light source device, is completed by adding such a simple construction as a baffle plate on a light source device comprising a blower, mirror, and light source and having a shutter where necessary, and more particularly a smaller light source device having a tubular elongated mercury-arc lamp, wherein said lamp has an electrical input power more than 90 watt per 1 cm of arc for servicing to dry ultraviolet hardened type printing ink, is easily completed because portions of the bulb wall on the upstream side and downstream side of the cooling flow can be cooled uniformly and efficiently even when the light source is cooled strongly from one direction, thereby preventing the output of light from reduction because of over-cooling of the bulb wall on the upstream side of the cooling flow and preventing the bulb wall on the downstream side of the cooling flow from local damage.

What is claimed is:

1. A light source device comprising an elongated box-shaped house, a cooling means provided on the back wall of said house, a gutter-shaped reflex mirror having a throat, a tubular elongated light source arranged within and along the axis of said house, and an elongated baffle plate positioned in parallel to and between said light source and said mirror, wherein said baffle plate has a slit arranged along its longitudinal axis and bent portions extending for covering said light source.

2. A device as claimed in claim 1, wherein said light source is a tubular elongated mercury-arc lamp energized more than 90 watt per 1 cm of arc.

3. A device as claimed in claim 1, wherein said baffle plate has the narrowest slit at the center and the largest at the opposite ends.

4. A device as claimed in claim 1, wherein said mirror has the narrowest throat at the center and the largest at the opposite ends.

* * * * *